(12) United States Patent
Tsai et al.

(10) Patent No.: US 11,049,796 B2
(45) Date of Patent: Jun. 29, 2021

(54) MANUFACTURING METHOD OF PACKAGING DEVICE

(71) Applicant: DELTA ELECTRONICS, INC., Taoyuan (TW)

(72) Inventors: Hsin-Chang Tsai, Taoyuan (TW); Chia-Yen Lee, Taoyuan (TW); Peng-Hsin Lee, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/856,797

(22) Filed: Apr. 23, 2020

(65) Prior Publication Data

US 2020/0251405 A1  Aug. 6, 2020

Related U.S. Application Data

(62) Division of application No. 14/549,996, filed on Nov. 21, 2014, now Pat. No. 10,685,904.

(51) Int. Cl.
*H01L 23/433* (2006.01)
*H01L 23/31* (2006.01)

(52) U.S. Cl.
CPC ...... *H01L 23/4334* (2013.01); *H01L 23/3107* (2013.01); *H01L 2224/04105* (2013.01); *H01L 2224/32245* (2013.01); *H01L 2224/73267* (2013.01); *H01L 2924/0002* (2013.01); *H01L 2924/15153* (2013.01)

(58) Field of Classification Search
CPC ............ H01L 23/4334; H01L 23/3107; H01L 2924/0002; H01L 2224/04105; H01L 2224/32245; H01L 2224/73267; H01L 2924/15153; H01L 23/34–4735

See application file for complete search history.

(56) References Cited

U.S. PATENT DOCUMENTS

| 6,432,749 B1 | 8/2002 | Libres |
| 6,577,504 B1 | 6/2003 | Lofland |
| 6,590,292 B1 | 7/2003 | Barber |

(Continued)

FOREIGN PATENT DOCUMENTS

| CN | 101308827 | 11/2008 |
| TW | I260060 | 8/2006 |

(Continued)

*Primary Examiner* — Hoang-Quan Ho
(74) *Attorney, Agent, or Firm* — Hauptman Ham, LLP

(57) ABSTRACT

A packaging device including a first semiconductor device, a thermal dissipating component, an encapsulation layer, a via, and a pad. The first semiconductor device includes a substrate, an active region, and an electrode. The active region is disposed between the substrate and the electrode. The substrate has a first surface opposite to the active region, and the electrode has a second surface opposite to the active region. The thermal dissipating component is disposed on the first surface of the substrate. The encapsulation layer encloses the second surface of the electrode and a part of the thermal dissipating component, such that another part of the thermal dissipating component is exposed by the encapsulation layer. The pad is disposed on the encapsulation layer. The via is disposed in the encapsulation layer and connects the pad to the electrode.

7 Claims, 7 Drawing Sheets

(56) References Cited

U.S. PATENT DOCUMENTS

| | | |
|---|---|---|
| 7,031,162 B2 | 4/2006 | Arvelo |
| 7,768,108 B2 | 8/2010 | Liu et al. |
| 7,787,252 B2 | 8/2010 | Mertol |
| 8,558,372 B2 | 10/2013 | Negoro |
| 8,648,456 B1 | 2/2014 | Mahler et al. |
| 9,082,743 B2 | 7/2015 | Hung |
| 9,177,957 B1 | 11/2015 | Lee |
| 2004/0061221 A1 | 4/2004 | Schaffer |
| 2004/0099944 A1 | 5/2004 | Kimura |
| 2005/0029651 A1 | 2/2005 | Tomioka |
| 2006/0237827 A1* | 10/2006 | Wu .................. H01L 23/3107 257/676 |
| 2007/0126115 A1 | 6/2007 | Yanagihara |
| 2009/0127700 A1 | 5/2009 | Romig |
| 2009/0283919 A1 | 11/2009 | Tsui et al. |
| 2010/0001410 A1 | 1/2010 | Kang |
| 2010/0142155 A1 | 6/2010 | Mertol |
| 2010/0308453 A1 | 12/2010 | Scheid |
| 2011/0084379 A1 | 4/2011 | Sato |
| 2011/0163457 A1* | 7/2011 | Mohan ............... H01L 25/0652 257/774 |
| 2012/0171814 A1 | 7/2012 | Choi |
| 2013/0010597 A1 | 1/2013 | Liu et al. |
| 2013/0043581 A1 | 2/2013 | Negoro |
| 2013/0217188 A1 | 8/2013 | Wang |
| 2013/0280826 A1 | 10/2013 | Scanlan |
| 2013/0300004 A1 | 11/2013 | Choi |
| 2014/0070396 A1* | 3/2014 | Kyozuka ................ H01L 24/24 257/698 |
| 2014/0346671 A1 | 11/2014 | Yu |
| 2014/0367848 A1* | 12/2014 | Chi .................... H01L 24/81 257/737 |
| 2015/0035134 A1 | 2/2015 | Hung |
| 2015/0091154 A1* | 4/2015 | Hsu ................... H01L 23/3677 257/712 |
| 2015/0123630 A1 | 5/2015 | Ribarich |
| 2015/0155218 A1 | 6/2015 | Hung |
| 2015/0187607 A1 | 7/2015 | Huang |
| 2015/0194362 A1 | 7/2015 | Otremba |
| 2015/0214127 A1 | 7/2015 | Gu |
| 2015/0262902 A1 | 9/2015 | Shen |
| 2015/0262972 A1 | 9/2015 | Katkar |
| 2015/0270190 A1 | 9/2015 | Kim |
| 2015/0318262 A1 | 11/2015 | Gu |

FOREIGN PATENT DOCUMENTS

| | | |
|---|---|---|
| TW | 201044530 | 12/2010 |
| TW | I405307 | 8/2013 |
| TW | M468012 | 12/2013 |
| TW | I431728 | 3/2014 |

* cited by examiner

MANUFACTURING METHOD OF PACKAGING DEVICE

RELATED APPLICATIONS

This application is a Divisional Application of the U.S. application Ser. No. 14/549,996, filed Nov. 21, 2014, of which is herein incorporated by reference.

BACKGROUND

Field of Invention

The present invention relates to a packaging device.

Description of Related Art

Integrated circuit (IC) assemblies for such complex electronic systems typically have a large number of interconnected IC chips, or dies. Integrated circuit chips are being fabricated with gradually smaller sizes and higher circuit densities. When the IC chips becomes denser in term of electrical power consumption per unit volume, heat generated is also increases correspondingly. As the state of the art progresses, the ability to adequately dissipate heat is often a constraint on the rising complexity of package design, higher device operating speed and power consumption.

SUMMARY

An aspect of the present invention is to provide a packaging device including a first semiconductor device, a thermal dissipating component, an encapsulation layer, a via, and a pad. The first semiconductor device includes a substrate, an active region, and an electrode. The active region is disposed between the substrate and the electrode. The substrate has a first surface opposite to the active region, and the electrode has a second surface opposite to the active region. The thermal dissipating component is disposed on the first surface of the substrate. The encapsulation layer encloses the second surface of the electrode and a part of the thermal dissipating component, such that another part of the thermal dissipating component is exposed by the encapsulation layer. The pad is disposed on the encapsulation layer. The via is disposed in the encapsulation layer and connects the pad to the electrode.

In one or more embodiments, a thickness of the thermal dissipating component is greater than a thickness of the pad.

In one or more embodiments, a quantity of heat dissipation through the first surface of the substrate is greater than a quantity of heat dissipation through the second surface of the electrode.

In one or more embodiments, the active region and the electrode form a GaN transistor.

In one or more embodiments, the packaging device further includes a solder disposed between the first semiconductor device and the thermal dissipating component.

In one or more embodiments, the solder is made from metal.

In one or more embodiments, the electrode of the first semiconductor device is spatially separated from the thermal dissipating component.

In one or more embodiments, the thermal dissipating component includes a first portion and a second portion separated from each other. The first portion is disposed on the first semiconductor device. The packaging device further includes a second semiconductor device, and the second portion is disposed thereon.

In one or more embodiments, the first portion of the thermal dissipating component has a cavity for accommodating the first semiconductor device.

In one or more embodiments, a thickness of the first semiconductor device is different from a thickness of the second semiconductor device.

In one or more embodiments, the second surface of the first semiconductor device and a surface of the second semiconductor device opposite to the thermal dissipating component are coplanar.

In one or more embodiments, the packaging device further includes a third semiconductor device electrically connected to the first portion and the second portion of the thermal dissipating component.

Another aspect of the present invention is to provide a method for manufacturing a packaging device including providing a thermal dissipating component. A first surface of the first semiconductor device is fixed on or above the thermal dissipating component. The thermal dissipating component and the first semiconductor device are covered by an encapsulation layer. The encapsulation layer encloses a part of the thermal dissipating component and another part of the thermal dissipating component is exposed by the encapsulation layer. A through hole is formed in the encapsulation layer to expose a portion of a second surface of the first semiconductor device. The second surface is opposite to the first surface. A via is formed in the through hole and a pad is formed on the via In one or more embodiments, the through hole is performed using photolithography process, laser drilling process, or mechanical machining process.

In one or more embodiments, the via and the pad are performed using copper electroplating process.

In one or more embodiments, the method further includes forming a solder between the first semiconductor device and the encapsulation layer.

In one or more embodiments, the solder is made from metal.

In one or more embodiments, the thermal dissipating component includes a first portion and a second portion separated from each other. The first semiconductor device is formed on the first portion, and the method further includes forming a second semiconductor device on the second portion, and the encapsulation layer encloses the second semiconductor device and the second portion of the thermal dissipating component.

In one or more embodiments, fixing the first semiconductor device on or above the thermal dissipation component includes fixing the first semiconductor device in a cavity in the thermal dissipating component.

In one or more embodiments, the method further includes forming a third semiconductor device to be electrically connected to the first portion and the second portion of the thermal dissipating component.

DETAILED DESCRIPTION

Figure 1:
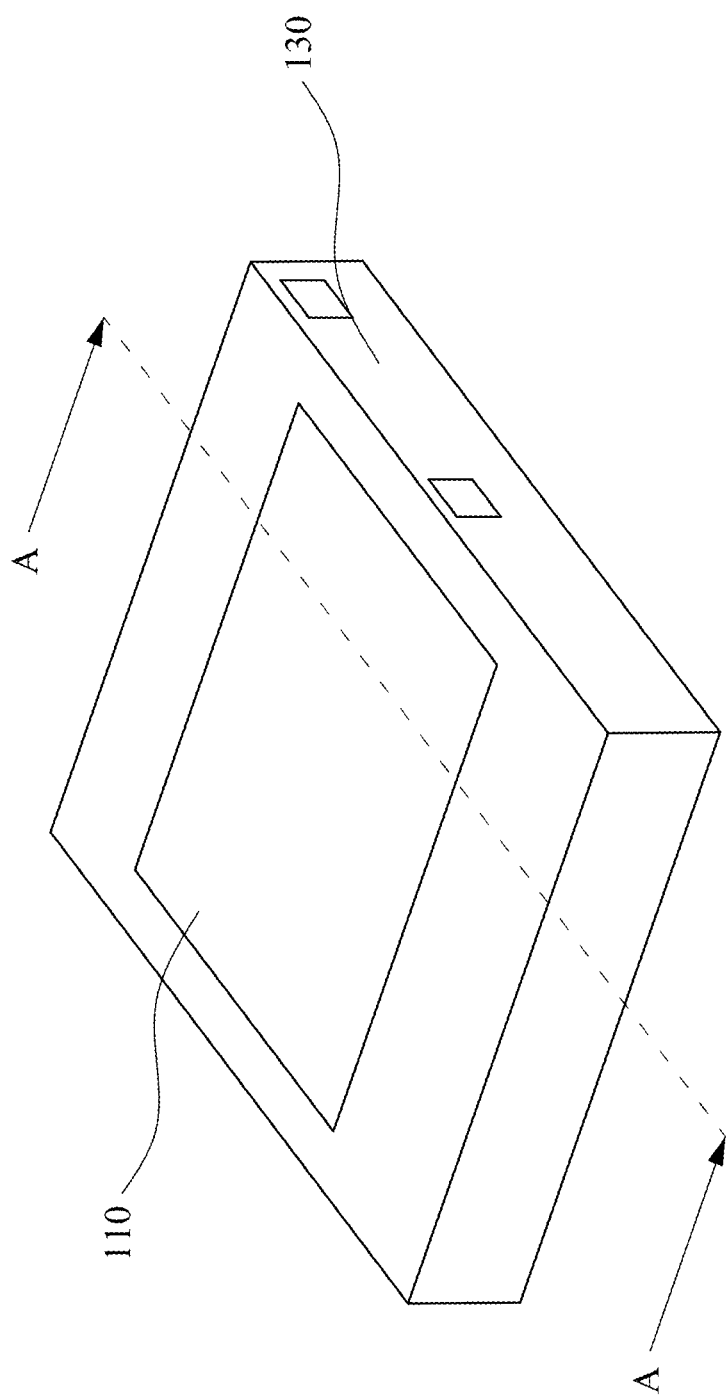
FIG. 1 is a schematic diagram of a packaging device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
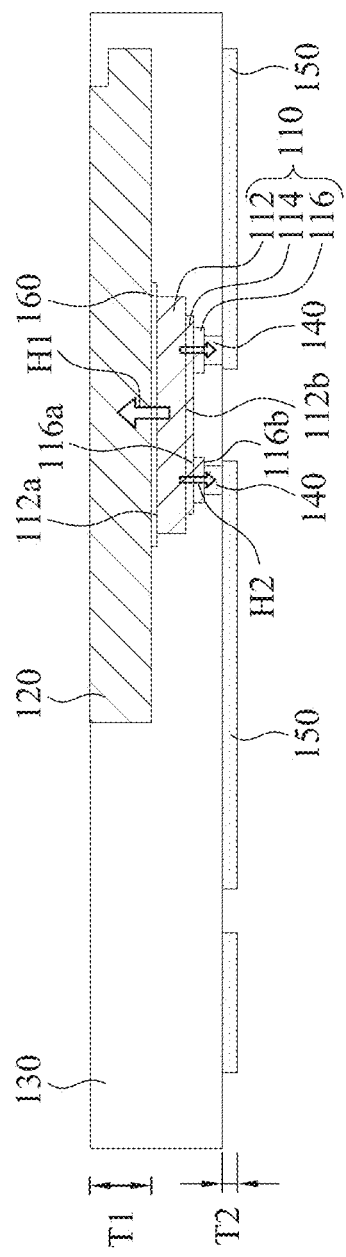
FIG. 2 is a cross-sectional view taken along line A-A of FIG. 1 according to one embodiment.

FIG. 1 is a schematic diagram of a packaging device according to one embodiment of the present invention, and FIG. 2 is a cross-sectional view taken along line A-A of FIG. 1 according to one embodiment. The packaging device includes a first semiconductor device 110, a thermal dissipating component 120, an encapsulation layer 130, a via 140, and a pad 150. The first semiconductor device 110, such as a flip-chip, includes a substrate 112, an active region 114, and an electrode 116. The active region 114, is disposed between the substrate 112 and the electrode 116. The substrate 112 has a first surface 112a opposite to the active region 114, and the electrode 116 has a second surface 116b opposite to the active region 114. More specifically, the substrate 112 has the first surface 112a and a second surface 112b opposite to each other, and the electrode 116 has a first surface 116a and the second surface 116b opposite to each other. The second surface 112b of the substrate 112 faces the active region 114, and the first surface 114a of the electrode 116 faces the active region 114. The thermal dissipating component 120 is disposed on the first surface 112a of the substrate 112. The encapsulation layer 130 encloses the second surface 116b of the electrode 116 and a part of the thermal dissipating component 120, such that another part of the thermal dissipating component 120 is exposed by the encapsulation layer 130. The pad 150 is disposed on the encapsulation layer 130. The via 140 is disposed in the encapsulation layer 130 and connects the pad 150 to the electrode 116. In some embodiments, the active region 114 and the electrode 116 can form a GaN transistor.

In this embodiment, since there is no electrically connection element to interconnect the thermal dissipating component 120 and the active region 114, i.e., the thermal dissipating component 120 and the pad 150 are spatially separated, the packaging device can have individual current path and individual thermal path to improve heat dissipation. In greater detail, the first semiconductor device 110 can be electrically connected to external devices or circuits (such as plate circuit boards) sequentially through the via 140 and the pad 150. This means the current of the first semiconductor device 110 flows to the external devices or circuits through the via 140 to the pad 150. On the other hand, the first semiconductor device 110 (more specifically, the active region 114) generates heat when it is in operation, and the heat can be mainly dissipated through the thermal dissipating component 120. Moreover, the heat dissipation efficiency is improved since a part of the thermal dissipating component 120 is exposed by the encapsulation layer 130. As a result, the current and the heat of the first semiconductor device 110 can mainly flow from opposite sides (i.e., the first surface 112a and the second surface 116b) of the first semiconductor device 110, respectively, such that the heat dissipation can be improved while the heat does not interfere with the electrical signal of the first semiconductor device 110. Moreover, since the encapsulation layer 130 encloses a part of the thermal dissipating component 120, i.e., the encapsulation layer 130 surrounds the thermal dissipating component 120 except the surface of the thermal dissipating component 120 opposite to the first semiconductor device 110, the thermal dissipating component 120 has high structure strength and is hard to be striped from the first semiconductor device 110 because of the encapsulation layer 130.

In this embodiment, the thickness T1 of the thermal dissipating component 120 is greater than the thickness T2 of the pad 150. In other words, the thermal dissipating component 120 has higher thermal conductance than that of the pad 150 if they are made from the same material such as copper. Hence, the quantity of heat dissipation H1 passing through the first surface 112a of the substrate 112 is greater than the quantity of heat dissipation H2 passing through the second surface 116b of the electrode 116. For example, over 50% of the heat generated from the active region 114 can be dissipated from the thermal dissipating component 120. Moreover, the contact area between the thermal dissipating component 120 and the first semiconductor device 110 is larger than the contact area between the via 140 and the first semiconductor device 110, facilitating the heat flow through the thermal dissipating component 120 rather than through the via 140 and the pad 150.

In this embodiment, the packaging device further includes a solder 160 disposed between the first semiconductor device 110 and the thermal dissipating component 120. The solder 160 is configured for fixing the first semiconductor device 110 to the thermal dissipating component 120. The solder 160 may be made from metal, such as tin, silver, or alloys.

In one or more embodiments, the electrodes 116, the vias 140 and the pads 150 can be plural. The pads 150 can be electrically connected to the different electrodes 116, such as a source electrode, a drain electrode, and a gate electrode, of the first semiconductor device 110 through different vias 140. Furthermore, since heat of the first semiconductor device 110 does not mainly flow through the vias 140, distance among the vias 140 can be extended to achieve high voltage device package.

Figure 3:
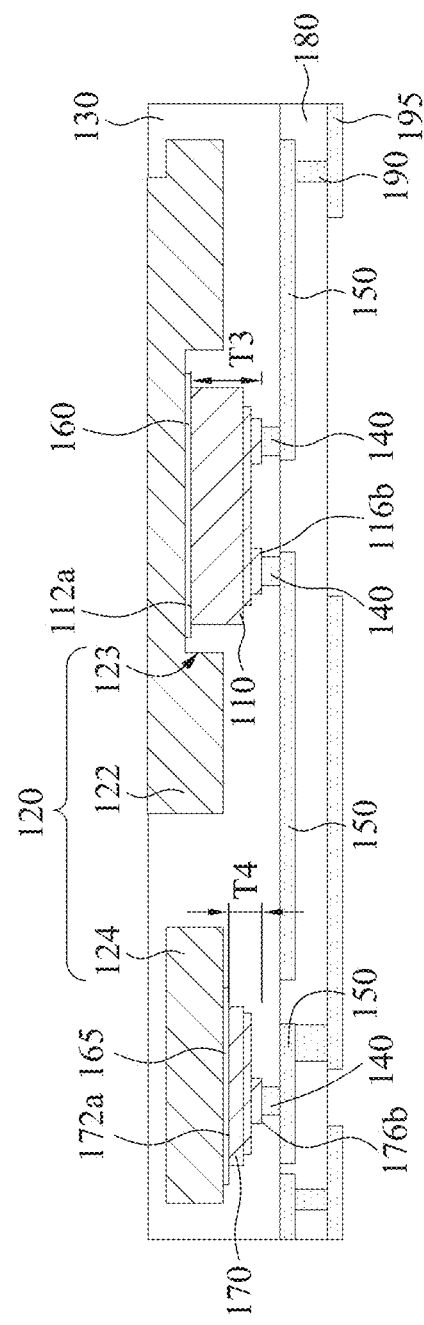
FIG. 3 is a cross-sectional view taken along line A-A of FIG. 1 according to another embodiment.

FIG. 3 is a cross-sectional view taken along line A-A of FIG. 1 according to another embodiment. In this embodiment, the packaging device includes a plurality of semiconductor devices. In greater detail, the thermal dissipating component 120 includes a first portion 122 and a second portion 124 separated from each other. The first portion 122 is disposed on the first semiconductor device 110. The packaging device further includes a second semiconductor device 170, and the second portion 124 is disposed thereon. In this embodiment, the current of the second semiconductor device 170 can flow to the external device or circuits through some of the vias 140 and some of the pads 150.

In this embodiment, both of the first semiconductor device 110 and the second semiconductor device 170 have individual current paths and heat paths. The currents flow from the second surfaces 116b and 176b of the first semiconductor device 110 and the second semiconductor device 170 while the heats mainly flow from the first surfaces 112a and 172a of the first semiconductor device 110 and the second semiconductor device 170. Therefore, the heat dissipation of both of the first semiconductor device 110 and the second semiconductor device 170 can be improved.

In this embodiment, the packaging device allows semiconductor devices with different heights to be packaged together. That is, the thickness T3 of the first semiconductor device 110 can be different from the thickness T4 of the second semiconductor device 170. For example, the thickness T3 of the first semiconductor device 110 is greater than the thickness T4 of the second semiconductor device 170, as shown in FIG. 3. Thus, the first portion 122 of the thermal dissipating component 120 can have a cavity 123 for accommodating the first semiconductor device 110. For example, the depth of the cavity 123 can be the height difference (i.e., T1-T2) between the first semiconductor device 110 and the second semiconductor device 170. In this way, the second surface 116b of the first semiconductor device 110 and a surface of the second semiconductor device 170 opposite to the thermal dissipating component 120 (i.e., the second surface 176b) are coplanar. This configuration facilitates convenience for manufacturing the vias 140.

In this embodiment, the solder 160 is disposed between the first semiconductor device 110 and the first portion 122 of the thermal dissipating component 120. The solder 160 is configured for fixing the first semiconductor device 110 to the first portion 122. Furthermore, the packaging device can further include a solder 165 disposed between the second semiconductor device 170 and the second portion 124 of the thermal dissipating component 120. The solder 165 is configured for fixing the second semiconductor device 170 to the second portion 124. Both of the solders 160 and 165 may be made from metal, such as tin, silver, or alloys.

In this embodiment, the packaging device can further include an insulating layer 180, a plurality of inter-pillars 190, and a patterned metal layer 195. The insulating layer 180 is disposed between the pads 150 and the patterned metal layer 195. The inter-pillars 190 are disposed within the insulating layer 180 and interconnect the pads 150 and the patterned metal layer 195. The pads 150, the inter-pillars 190, and the patterned metal layer 195 can form different circuits that depends on the electrically connection between the first semiconductor device 110 and the second semiconductor device 170. In some embodiments, the inter-pillars 190 and the patterned metal layer 195 can be formed from copper, and the claimed scope is not limited in this respect. Other relevant structural details of the packaging device of FIG. 3 are all the same as the packaging device of FIG. 2, and, therefore, a description in this regard will not be repeated hereinafter.

Figure 4A:
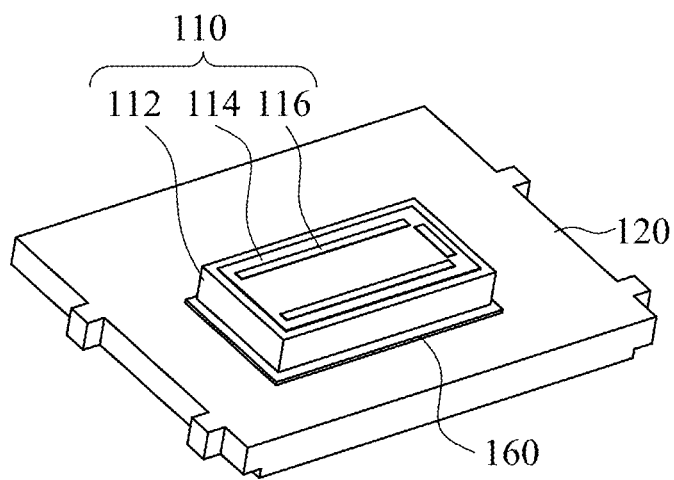
FIGS. 4A-4D are schematic diagrams of a method for manufacturing the packaging device of FIG. 2.

FIGS. 4A-4D are schematic diagrams of a method for manufacturing the packaging device of FIG. 2. Reference is made to FIG. 4A. A thermal dissipating component 120 is provided. In this embodiment, the thermal dissipating component 120 is a pre-formed metal plate, such as copper plate. This means the thermal dissipating component 120 is no longer to be cut or shaped during the following manufacturing processes. Subsequently, a first surface 112a (see FIG. 2) of a first semiconductor device 110 is fixed above the thermal dissipating component 120. The first surface 112a is a surface without any circuit layout. That is, the current of the first semiconductor device 110 does not flow through the first surface 112a. The first semiconductor device 110 can be attached to the thermal dissipating component 120 using a solder 160 or a die attached material. That is, the solder 160 is formed between the first semiconductor device 110 and the thermal dissipating component 120. In some embodiments, the solder 160 can be made from metal, such as tin, silver, or alloys.

In this embodiment, the first semiconductor device 110 includes a substrate 112, an active region 114, and an electrode 116. The active region 114 is disposed between the substrate 112 and the electrode 116. The first semiconductor device 110 can be a flip-chip, and the active region 114 and the electrode 116 can form a GaN transistor. The electrodes 116 can be a source electrode, a drain electrode, or a gate electrode. However, the type of the active region 114 is not limited in this respect.

Figure 4B:
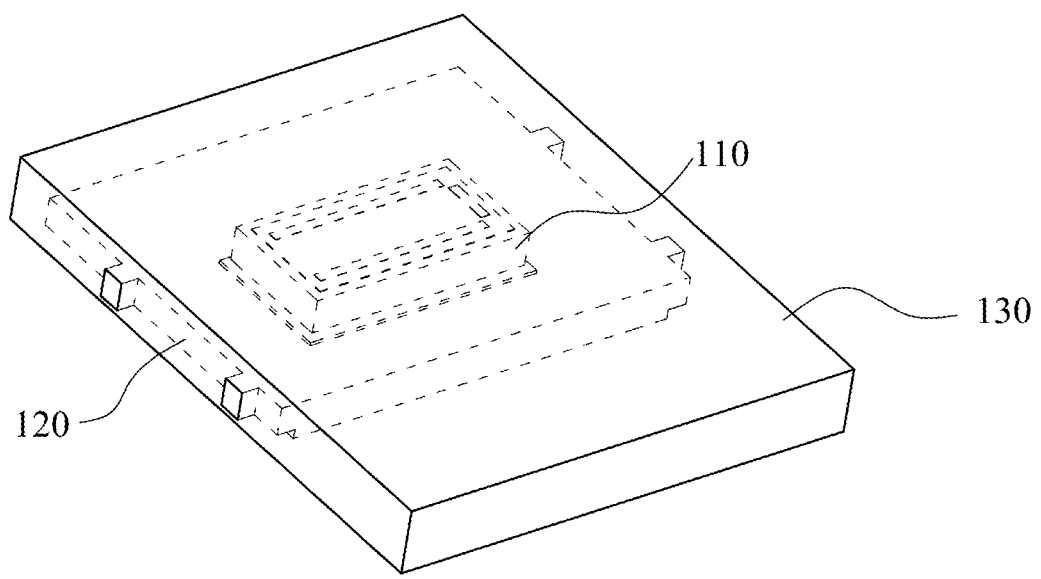

Reference is made to FIGS. 4B and 2. Then, the thermal dissipating component 120 and the first semiconductor device 110 are covered by an encapsulation layer 130. The encapsulation layer 130 encloses a part of the thermal dissipating component 120 and another part of the thermal dissipating component 120 is exposed by the encapsulation layer 130, as shown in FIG. 2. In other words, the thermal dissipating component 120 and the first semiconductor device 110 are covered by the encapsulation layer 130 except the exposed part of the thermal dissipating component 120. In some embodiments, the encapsulation layer 130 can be performed using epoxy, resin, or insulating materials, and the encapsulation layer 130 can be made from polymer materials.

Figure 4C:
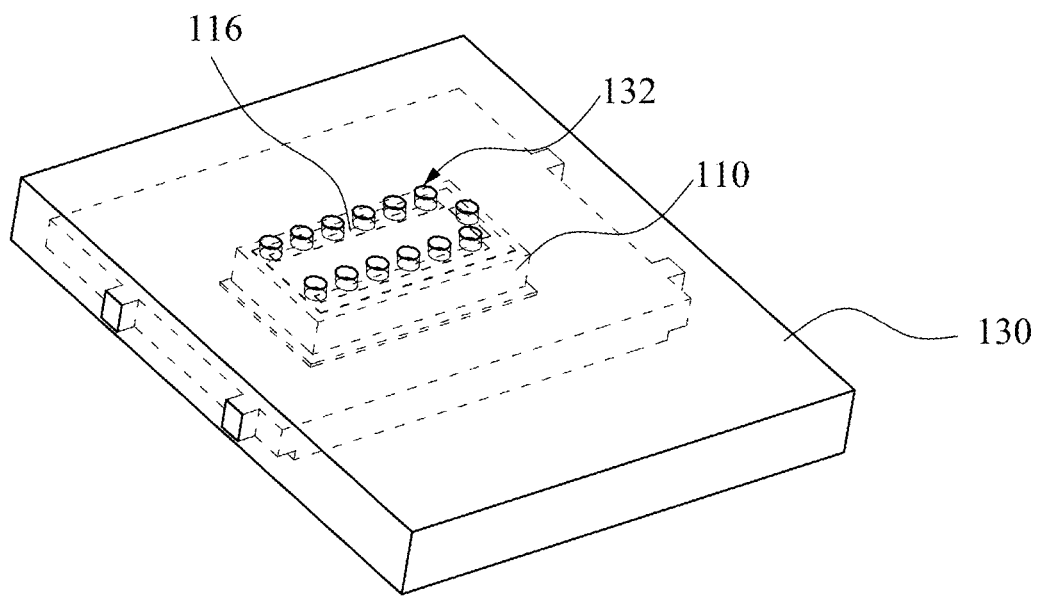
Figure 4D:
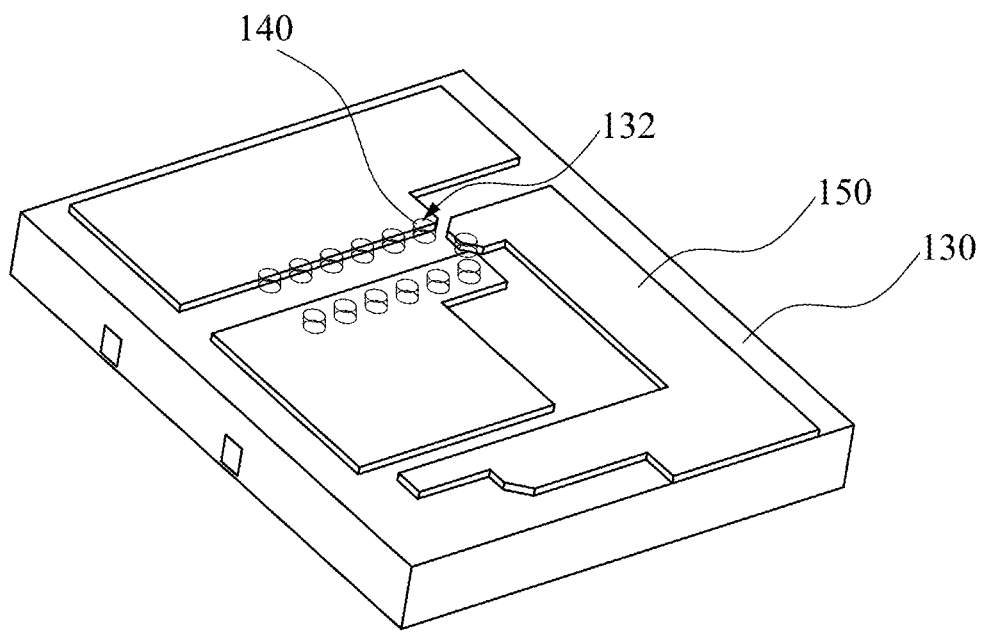

Reference is made to FIG. 4C. For clarity, the embedded portion of through holes in FIGS. 4C to 4D are depicted with thin lines. A plurality of through holes 132 are formed in the encapsulation layer 130 to expose a portion of a second surface 116b (see FIG. 2) of the first semiconductor device 110. That is, the through holes 132 can respectively expose portions of the electrodes 116 of the first semiconductor device 110. In some embodiments, the through holes 132 can be performed using photolithography process, laser drilling process, or mechanical machining process.

Reference is made to FIG. 4D. A plurality of vias 140 are formed in the through holes 132. In some embodiments, the vias 140 are performed using copper electroplating process. In other words, the vias 140 are made from copper. A copper electrolyte can be filled in the through holes 132 to form the vias 140. Subsequently, a plurality of pads 150 are formed on the vias 140 and the encapsulation layer 130. For example, a copper layer can be formed on the vias 140 and the encapsulateon layer 130 using copper electroplating process or laminating process. Then, the copper layer is patterned to be the pads 150, whose patterns are not limited in the structure shown in FIG. 4D. Each pad 150 can be electrically connected to different electrode 116 (see FIG. 4C) of the first semiconductor device 110. As a result, the manufacturing process of the packaging device is complete.

Figure 5A:
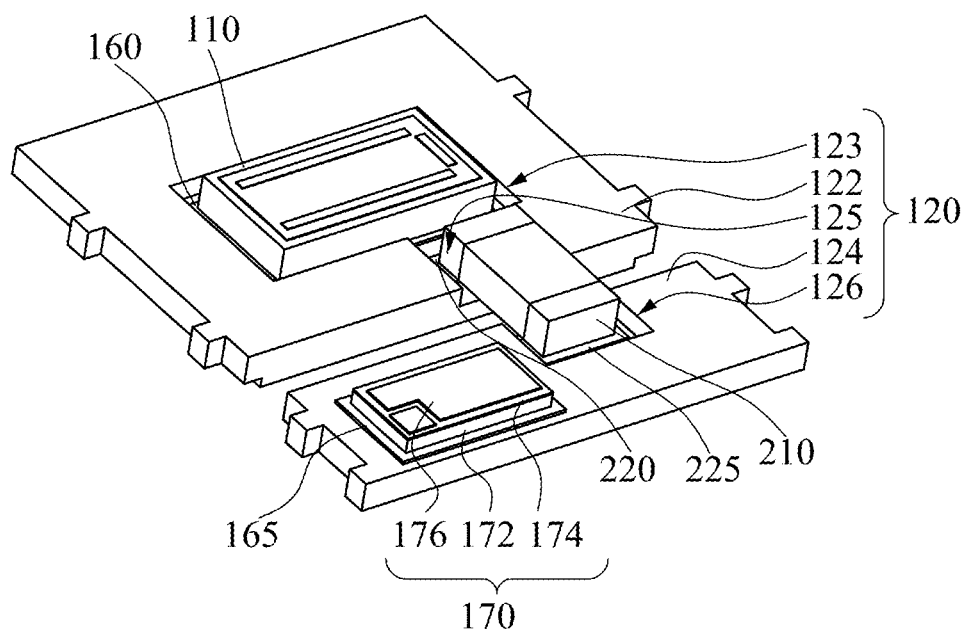
FIGS. 5A-5F are schematic diagrams of a method for manufacturing the packaging device of FIG. 3.

FIGS. 5A-5F are schematic diagrams of a method for manufacturing the packaging device of FIG. 3. In the following paragraphs, the manufacturing details described before are not repeated hereinafter, and only further information is supplied to perform the packaging device of FIG. 3. Reference is made to FIG. 5A. A thermal dissipating component 120 is provided. The thermal dissipating component 120 includes a first portion 122 and a second portion 124, and both of the first portion 122 and a second portion 124 are pre-performed metal plates. Subsequently, a first surface 112a (see FIG. 3) of a first semiconductor device 110 is fixed above the first portion 122 of the thermal dissipating component 120, and a first surface 172a (see FIG. 3) of a second semiconductor device 170 is fixed above the second portion 124 of the thermal dissipating component 120. The first surfaces 112a and 172a are surfaces without any circuit layout. The first semiconductor device 110 can be attached to the first portion 122 using a solder 160 or a die attached material, and the second semiconductor device 170 can be attached to the second portion 124 using a solder 165 or a die attached material. That is, the solder 160 is formed between the first semiconductor device 110 and the first portion 122, and the solder 165 is formed between the second semiconductor device 170 and the second portion 124. In some embodiments, the solders 160 and 165 can be made from metal, such as tin, silver, or alloys.

In this embodiment, the second semiconductor device 170 includes a substrate 172, an active region 174, and an electrode 176. The active region 174 is disposed between the substrate 172 and the electrode 176. Furthermore, reference is made to FIGS. 5A and 3. The thickness T2 of the second semiconductor device 170 can be different from the thickness T1 of the first semiconductor device 110. For example, the thickness T1 is greater than the thickness T2. Hence, a cavity 123 can be formed in the first portion 122 of the thermal dissipating component 120. The depth of the cavity 123 can be substantially the difference between the thickness T1 and T2. Therefore, the second surfaces 116b and 176b are coplanar as shown in FIG. 3.

Reference is made again to FIG. 5A. In this embodiment, a third semiconductor device 210 can be fixed above the first portion 122 and the second portion 124 of the thermal dissipating component 120. That is, the third semiconductor device 210 is electrically connected to the first portion 122 and the second portion 124 of the thermal dissipating component 120. The third semiconductor device 210 can be attached to the first portion 122 using a solder 220 and to the second portion 124 using a solder 225. In some embodiments, the solders 220 and 225 can be made from metal, such as tin, silver, or alloys. Moreover, if the third semiconductor device 210 is thicker than the second semiconductor device 170, a cavity 125 can be formed in the first portion 122 and a cavity 126 can be formed in the second portion 124 to together accommodate the third semiconductor device 210.

Figure 5B:
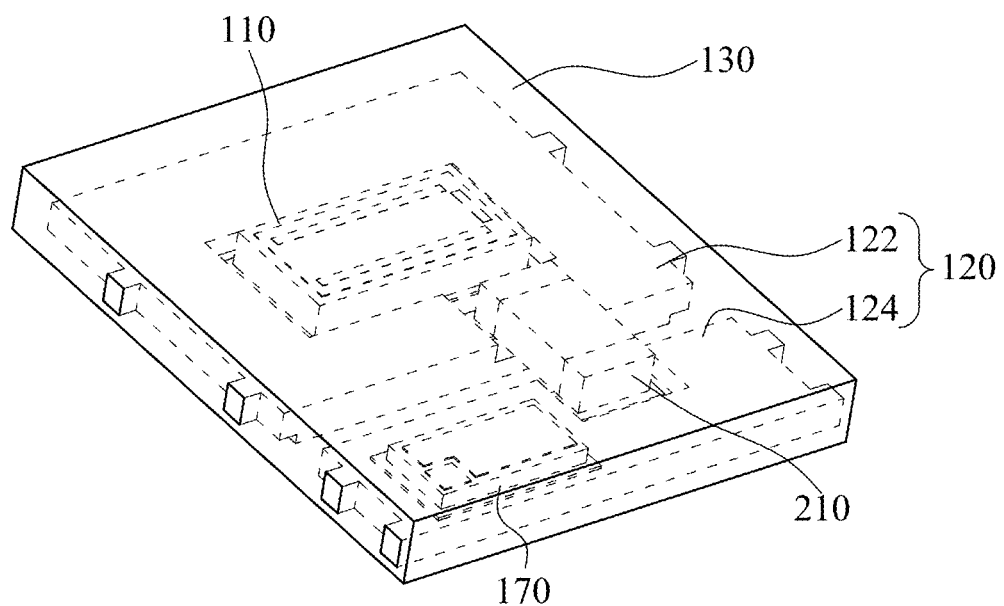

Reference is made to FIGS. 5B and 3. Then, the thermal dissipating component 120, the first semiconductor device 110, the second semiconductor device 170, and the third semiconductor device 210 are all covered by an encapsulation layer 130. The encapsulation layer 130 encloses the second portion 124 and a part of the first portion 122 of the thermal dissipating component 120, and another part of the first portion 122 is exposed by the encapsulation layer 130, as shown in FIG. 3. In other words, the thermal dissipating component 120 and the first semiconductor device 110 are covered by the encapsulation layer 130 except the exposed part of the first portion 122.

Figure 5C:
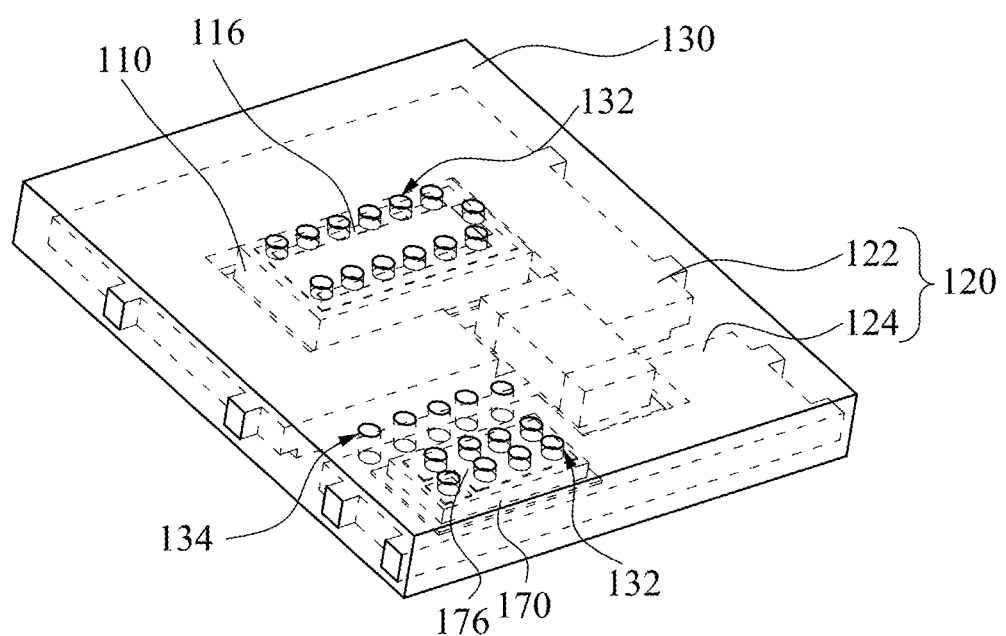

Reference is made to FIG. 5C. For clarity, the embedded portion of through holes in FIGS. 5C to 5F, are depicted with thin lines. A plurality of through holes 132 are formed in the encapsulation layer 130 to expose a portion of a second surface 116b (see FIG. 3) of the first semiconductor device 110 and a second surface 176b (see FIG. 3) of the second semiconductor device 170. That is, the through holes 132 can respectively expose portions of the electrodes 116 and 176 of the first semiconductor device 110 and the second semiconductor device 170. Moreover, in some embodiments, a plurality of through holes 134 can be formed in the encapsulation layer 130 to expose a portion of the second portion 124 of the thermal dissipating component 120.

Figure 5D:
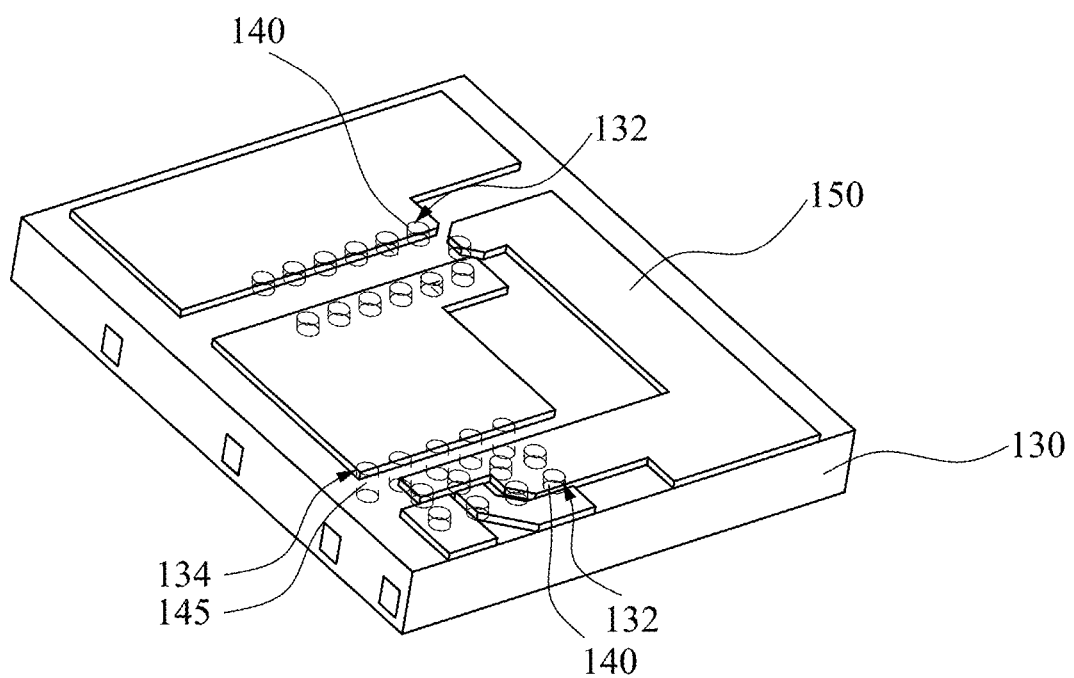

Reference is made to FIG. 5D. A plurality of vias 140 are formed in the through holes 132 and a plurality of vias 145 are formed in the through holes 134. In some embodiments, the vias 140 and 145 are performed using copper electroplating process. In other words, the vias 140 and 145 are made from copper. A copper electrolyte can be filled in the through holes 132 and 134 to form the vias 140 and 145. Subsequently, a plurality of pads 150 are formed on the vias 140 and 145 and the encapsulation layer 130. For example, a copper layer can be formed on the vias 140, 145 and the encapsulateon layer 130 using copper electroplating process or laminating process. Then, the copper layer is patterned to be the pads 150, whose patterns are not limited in the structure shown in FIG. 5D. Each pad 150 can be electrically connected to the electrode 116 (see FIG. 5C) of the first semiconductor device 110, the electrode 176 (see FIG. 5C) of the second semiconductor device 170, or the second portion 124 of the thermal dissipating component 120. Moreover, since the vias 145 interconnect some of the pads 150 and the second portion 124 of the thermal dissipating component 120, and the third semiconductor device 210 (see FIG. 5B) is electrically connected to the first portion 122 and the second portion 124, the first portion 122 and the second portion 124 can be as portions of circuit of the packaging device. However, the vias 145 can be omitted if there is no need to interconnect the second portion 124 and the pad 150. As a result, the manufacturing process of the packaging device is complete.

Figure 5E:
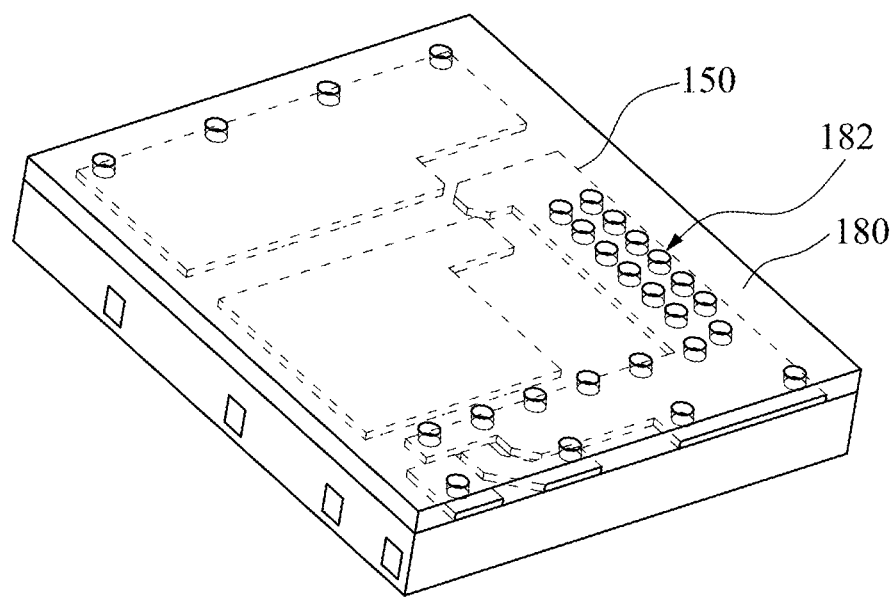

Reference is made to FIG. 5E. In some embodiments, after the step of FIG. 5D, an insulating layer 180 can be formed on and cover the pads 150. Then, a plurality of through holes 182 are formed in the insulating layer 180 to expose portions of the pads 150. In this embodiment, the insulating layer 180 can be made from epoxy, resin, or insulating materials, the insulating layer 180 is formed using molding process, and the through holes 182 are formed using photolithography process, laser drilling process, or mechanical machining process.

Figure 5F:
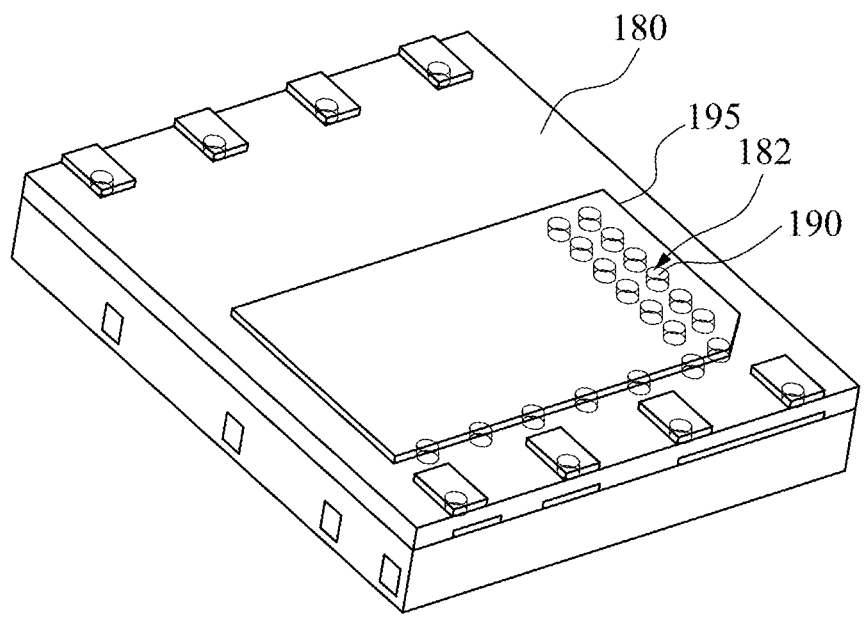

Reference is made to FIG. 5F. A plurality of inter-pillars 190 are formed in the through holes 182, and a patterned metal layer 195 is formed on the inter-pillars 190 and the insulating layer 180. Since the manufacturing process of the inter-pillars 190 and the patterned metal layer 195 are the same as that of the vias 140 and the pads 150, a description in this regard will not be repeated hereinafter. The pads 150 (see FIG. 5E), the inter-pillars 190, and the patterned metal layer 195 can form different circuits that depends on the electrically connection between the first semiconductor device 110 and the second semiconductor device 170 (see FIG. 5A). As a result, the manufacturing process of the packaging device is complete.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a packaging device, comprising:
   providing a thermal dissipating component, wherein the thermal dissipating component comprises a first portion and a second portion separated from each other;
   fixing a first surface of a first semiconductor device on or above the thermal dissipating component, wherein the first semiconductor device is formed on the first portion;
   forming a second semiconductor device on the second portion;
   covering the thermal dissipating component the first semiconductor device, and the second semiconductor device by an encapsulation layer, wherein the encapsulation layer encloses the second portion of the thermal dissipating component and the first portion of the thermal dissipating component is exposed by the encapsulation layer;

forming a through hole in the encapsulation layer to expose a portion of a second surface of the first semiconductor device, wherein the second surface is opposite to the first surface; and forming a via in the through hole and a pad on the via.

2. The method of claim 1, wherein the through hole is performed using photolithography process, laser drilling process, or mechanical machining process.

3. The method of claim 1, wherein the via and the pad are performed using copper electroplating process.

4. The method of claim 1, further comprising:
forming a solder between the first semiconductor device and the thermal dissipating component.

5. The method of claim 4, wherein the solder is made from metal.

6. The method of claim 1, wherein fixing the first semiconductor device on or above the thermal dissipating component comprises:
fixing the first semiconductor device in a cavity of the thermal dissipating component.

7. The method of claim 1, further comprising:
forming a third semiconductor device to be electrically connected to the first portion and the second portion of the thermal dissipating component.

\* \* \* \* \*